United States Patent [19]
Naito

[11] Patent Number: 4,739,305
[45] Date of Patent: Apr. 19, 1988

[54] DOUBLE INTEGRAL TYPE A/D CONVERTER

[75] Inventor: Kazufumi Naito, Ohtsu, Japan

[73] Assignee: Ishida Scales Mfg. Co., Ltd., Kyoto, Japan

[21] Appl. No.: 856,963

[22] Filed: Apr. 29, 1986

[30] Foreign Application Priority Data

Apr. 29, 1985 [JP] Japan ............................. 60-092018
Apr. 29, 1985 [JP] Japan ............................. 60-092019

[51] Int. Cl.$^4$ ................................... H03M 1/00
[52] U.S. Cl. ................. 340/347 AD; 340/347 CC; 340/347 NT
[58] Field of Search ............. 340/347 AD, 347 CC, 340/347 NT; 357/36; 361/403, 408

[56] References Cited

U.S. PATENT DOCUMENTS

3,747,088  7/1973  Pastoriza ......................... 357/36 X
3,893,103  7/1975  Prill ................................ 340/347 NT

*Primary Examiner*—William M. Shoop, Jr.
*Assistant Examiner*—Richard K. Blum
*Attorney, Agent, or Firm*—Staas & Halsey

[57] ABSTRACT

Herein disclosed is a double integral type A/D converter for converting an analog signal into a digital signal. The A/D converter (includes), as circuit elements an integrator having its one terminal made receptive of one of an unknown input voltage and a reference voltage; a comparator connected with the output of the integrator and including a transistor having its collector or drain opened; and an offset correction circuit connected between the output of the comparator and another terminal of the integrator for feeding back the output of the comparator. The offset correction circuit including a series circuit of a switch, a resistor $R_0$ and an auto-zero capacitor $C_0$. The converter also includes a flip-flop made responsive to the output signal of the comparator for switching the operational mode of the integrator from an integration mode to an offset correction mode; and a counter for counting the inverse integration period of the reference voltage. These circuit elements, as recited, are packaged into a hybrid IC.

8 Claims, 12 Drawing Sheets

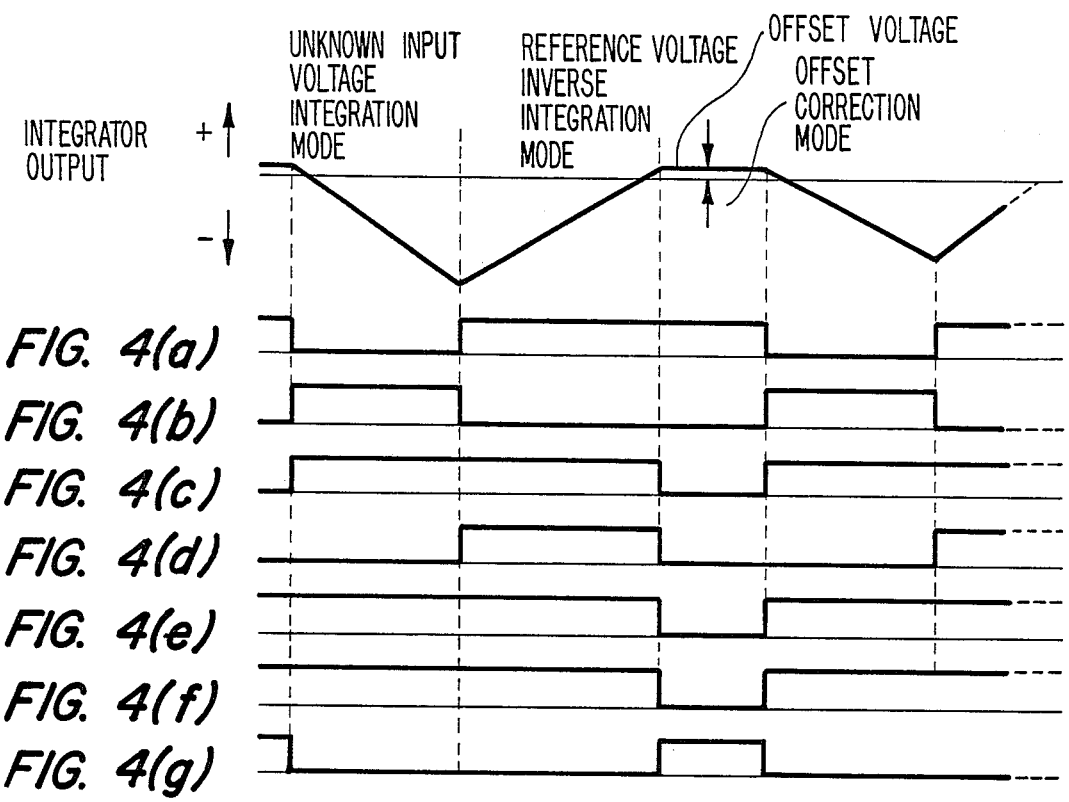
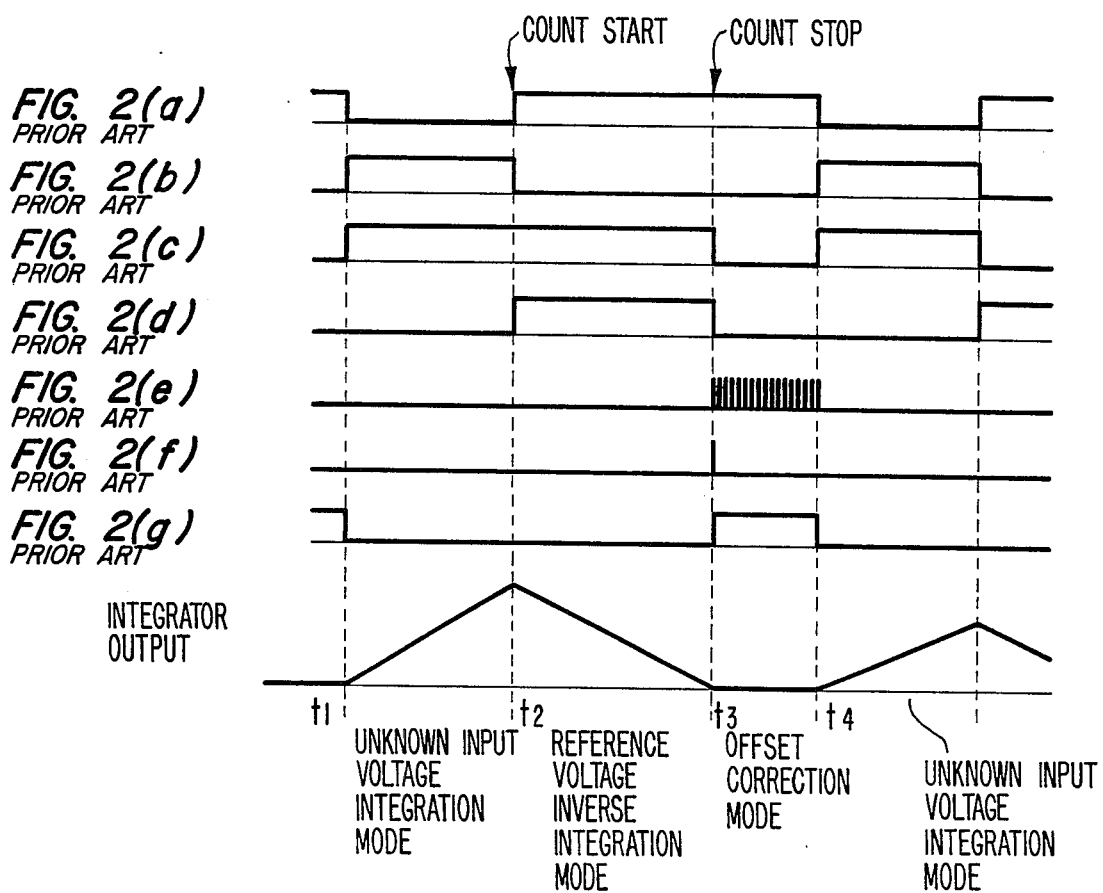

UNKNOWN INPUT
VOLTAGE
INTEGRATION
PERIOD

REFERNCE VOLTAGE
INVERSE
INTEGRATION
PERIOD

OFFSET VOLTAGE
CORRECTION
PERIOD

| UNKNOWN INPUT VOLTAGE INTEGRATION MODE | REFERENCE VOLTAGE INVERSE INTEGRATION MODE | OFFSET CORRECTION MODE |

DOUBLE INTEGRAL TYPE A/D CONVERTER

BACKGROUND OF THE INVENTION

1. Field of the Invention

The present invention relates to a double integral type A/D converter for converting an analog signal into a digital signal and, more particularly, to a double integral type A/D converter for use with an electronic weighing system.

2. Description of the Prior Art

In an electronic weighing system required to have a high accuracy, the double integral type analog-to-digital converter (which will be shortly referred to as the "A/D converter") has been used as a converter for converting an analog signal into a digital signal.

Before entering into a detailed description of the present invention, a cursory review will be made of the prior art with reference to FIGS. 1 and 2 of the accompanying drawings.

An A/D converter capable of having an unknown input integration period changed freely by a computer has been proposed to have a structure as shown in FIG. 1. In FIG. 1: reference letter A denotes a buffer; letter B an integrator; letter C a comparator; letter D a zero crossing detector; letter E a flip-flop; letter F a counter; letter G a CPU (i.e., Central Processing Unit); and letter H an inverter and letter I an AND gate.

The operations of the circuit thus composed will be described with reference to the timing chart of FIG. 2.

When a start signal for starting the integration is output at a time $t_1$ from the CPU G, the counter F is cleared by the output signal inverted by the inverter H, and a switch $S_1$ is turned on to input an unknown input voltage $V_{IN}$ through the buffer A to the integrator so that the integration of the unknown input voltage $V_{IN}$ is started [as depicted by a waveform (b)] in FIG. 2. Simultaneously with this, the flip-flop E is set to output a signal H (at a High level) from its Q terminal [as depicted by a waveform (c) in FIG. 2]. Here, the flip-flop E is so constructed that it is set and reset when the input signal falls from the H (high) level to an L (low) level.

At a time $t_2$ when the unknown input voltage integration period terminates, the start signal from the CPU G takes the H level [as depicted by a waveform (a)] of FIG. 2 so that the switch $S_1$ is turned off whereas a switch $S_2$ is turned on to input a reference voltage $V_{ref}$ through the buffer A to the integrator B. At this instant, the count is started to generate an output in a reference voltage inverse-integrator mode from the integrator B.

Here, the double integral type A/D converter is equipped with a correction circuit for correcting the offset of a system including the integrator B. This correction circuit is constructed to feed back the output of the comparator C, which is connected with the output of the integrator B, back to the integrator B. If the count is stopped at a time $t_3$ so that the operation changes into a mode for correcting the offset of the integrator B, the comparator C enters into an oscillation mode in which its output oscillates between the "H" and "L" levels [as depicted by a waveform (e)] of FIG. 2.

If this oscillatory state is caused, the output of the comparator C cannot be directly input to the flip-flop E which is made operative to control the switching of the integration modes—because the flip-flop E may possibly have its reset and set terminals active simultaneously. With this in mind, therefore, there has been connected to the output of the comparator C the zero crossing detector D which is composed of a multivibrator, a logical operation circuit and so on, so that a one shot pulse is output at the time $t_3$ and input to the flip-flop E for switching the modes of the integrator B [as depicted by a waveform (g)] of FIG. 2.

As a result, the flip-flop E is reset to input its output pulses as a zero crossing signal from its $\bar{Q}$ terminal to the CPU G [as depicted by the waveform (g)] of FIG. 2.

Thus, the double integral type A/D converter of the prior art is accompanied by a problem in that it requires the zero crossing detector having such a complicated circuitry as to increase the number of its parts and raise its fabrication cost.

Since, in the offset mode, the input level of the integrator does not correspond to the offset voltage of the buffer connected upstream of the integrator, there arises another problem in that an auto-zero capacitor $C_0$ connected with the other input of the integrator is not accurately charged with the offset voltage of the whole system including the buffer, the integrator and the comparator.

In another aspect, the A/D converter having the structure thus far described is suitably used with electronic weighing systems of various types having coarse to fine accuracies and can find remarkably wide applications. Therefore, an attempt has been made to assemble the A/D converter into a single package so that the number of steps of assembly on the production line may be reduced while the quality of the package is improved.

In the single package of the prior art, however, there has been used a hybrid IC (i.e., Integrated Circuit), which is prepared, for example, by forming a circuit pattern on a ceramic substrate, by connecting circuit elements such as resistors, capacitors, transistors and/or semiconductor elements with the circuit pattern, and by molding those circuit elements with a silicon resin, an epoxy resin or the like. Despite this structure, however, the hybrid IC is accompanied by the following problems:

(1) Because of lower heat resistance, the hybrid IC has to be held at a lower temperature during the temperature test for the final product than a monolithic IC so that it cannot be temperature tested over a wider range. In other words, the hybrid IC cannot be burned in under the same conditions as the monolithic IC.

(2) The single package using the hybrid IC cannot be as small as that using a monolithic IC.

(3) Since the single package using the hybrid IC is simply coated, its heat resistance becomes liable to deterioration by cracking, if any, thereby to producing inferior products.

SUMMARY OF THE INVENTION

It is, therefore, an object of the present invention to solve the above-specified problems concomitant with the prior art and to provide a double integral type A/D converter which has its characteristics improved by replacing the zero crossing detector with simple circuitry such that a capacitor connected with the input of the integrator may be charged with the offset voltage of the whole system.

Another object of the present invention is to provide a double integral type A/D converter which can be constructed as a single package, can have heat resistance and reliability similar to the monolithic IC and can be smaller than the prior art.

According to a primary feature of the present invention, there is provided a double integral type A/D converter for converting an analog signal into a digital signal, comprising: an integrator having one terminal receptive to an unknown input voltage and a reference voltage; a comparator connected with the output of said integrator and including a transistor having a collector or drain open; and offset correction means connected between the output of said comparator and the other terminal of said integrator for feeding back the output of said comparator and including a series circuit having a switch, a resistor $R_0$ and an auto-zero capacitor $C_0$. Also included are a flip-flop made responsive to the output signal of said comparator for switching the operational mode of said integrator from an integration mode to an offset correction mode; and a counter for counting the inverse integration period of said reference voltage. The invention further includes reset means for inverting the output of said comparator at the zero crossing instant of the output of said integrator for resetting said flip-flop to stop the operation of said counter; and integration means inserted into said offset correction means and including a resistor $R_c$ and a capacitor $C_c$ for turning on said switch to shift said integrator to said offset correction mode so that said auto-zero capacitor $C_0$ may be charged with a voltage corresponding to the offset voltage of the whole system from said integrator to said comparator.

According to a secondary feature of the present invention, there is provided a double integral type A/D converter for converting an analog signal into a digital signal comprising, as circuit elements: a group of switches for selectively outputting an input signal; an integrator made receptive of the signal output selectively from said grouped switches for integrating same; a comparator connected with the output of said integrator and including a transistor having its collector or drain open; and offset correction means for correcting the offset voltage of the whole system from said integrator to said comparator. Also included is a counter for counting the inverse integration period of a reference voltage; and a flip-flop for controlling said grouped switches, said offset correction circuit and said counter in a predetermined manner. Further included are a lead frame for a semiconductor IC; a wired insulating sheet applied to said lead frame and mounting thereon at least said circuit elements as chips; a plurality of wires bonded to said insulating sheet for connecting said circuit elements; and a resin armoring said lead frame, said insulating sheet and said wires together with said circuit elements creating by transfer molding, into a hybrid integrated circuit.

BRIEF DESCRIPTION OF THE DRAWINGS

Other objects, features and advantages of the present invention will become apparent from the following description taken in conjunction with the embodiments thereof with reference to the accompanying drawings, in which:

FIG. 2 is a timing chart for explaining the operations of the example of FIG. 1;

FIG. 4 is a timing chart for explaining the operations of the A/D converter of FIG. 3;

FIG. 7 is a timing chart for explaining the operations of the second embodiment of FIG. 6;

DESCRIPTION OF THE PREFERRED EMBODIMENTS

Figure 3:
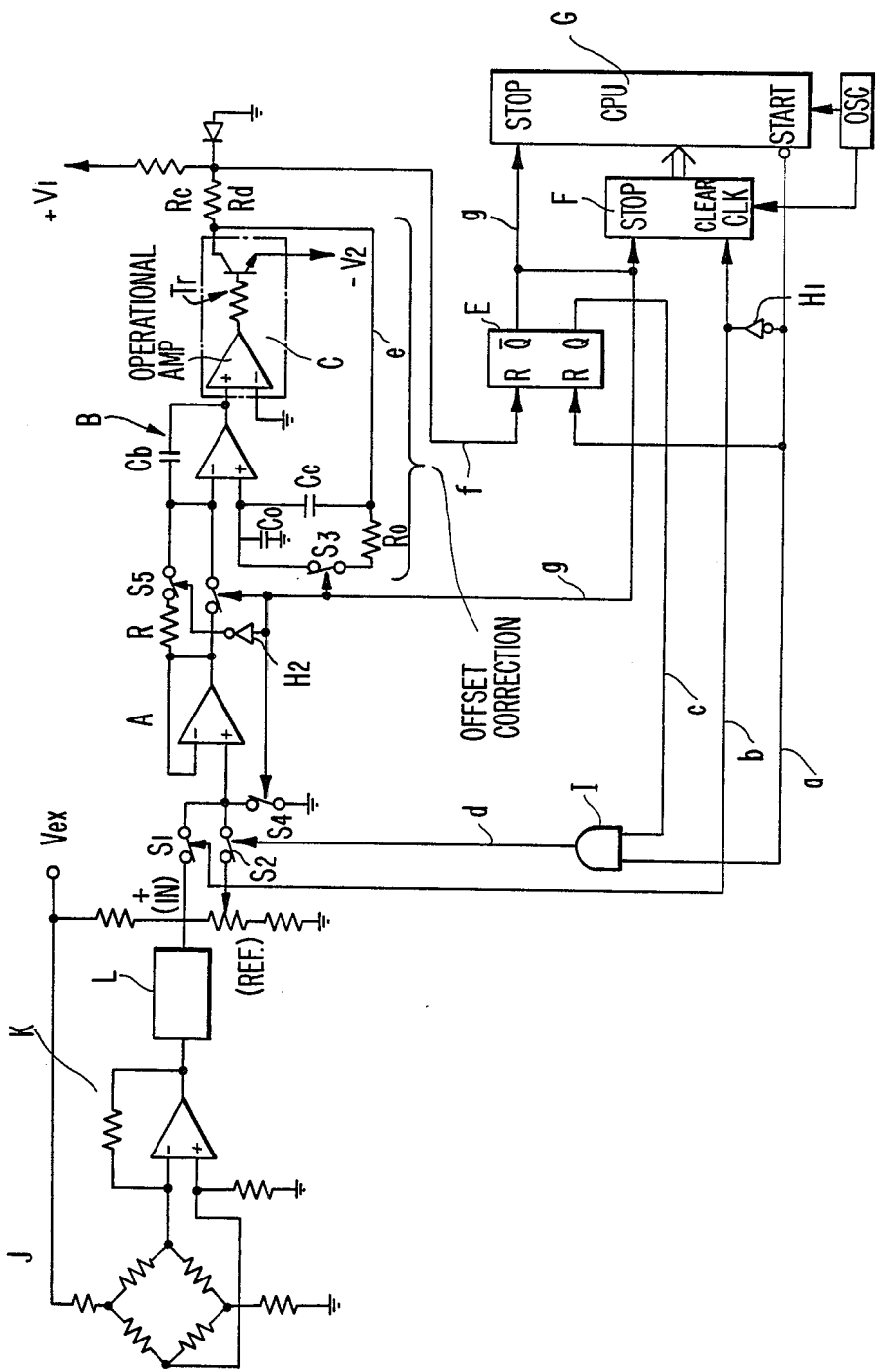
FIG. 3 is a circuit diagram showing a double integral type A/D converter according to a first embodiment of the present invention.

The present invention will be described in connection with the embodiments thereof with reference to FIGS. 3 to 14 of the accompanying drawings. FIG. 3 is a circuit diagram showing an embodiment in which the double integral type A/D converter of the present invention is used with an electronic weighing system. In this embodiment, a weight signal detected by a load cell J is output through a pre-amplifier K to a low-pass filter L and is used as the unknown input voltage of the double integral type A/D converter.

Figure 1:
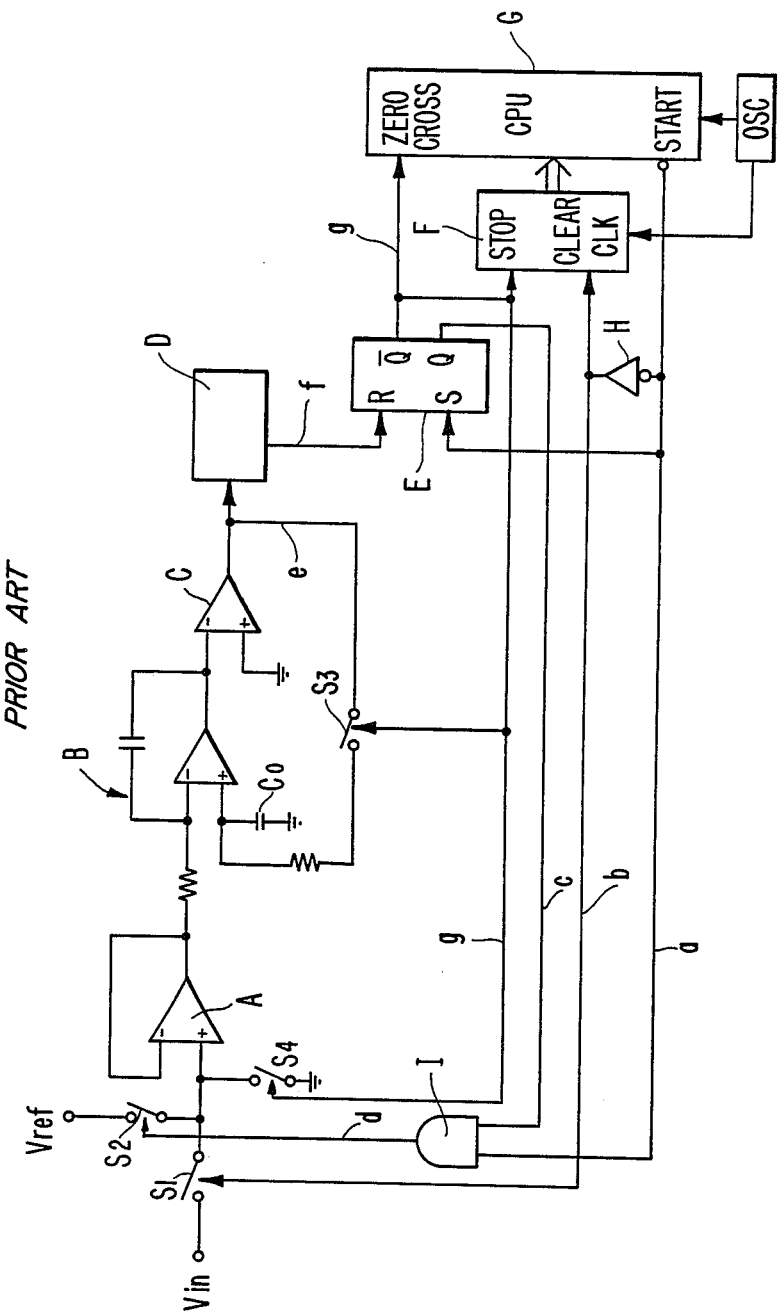
FIG. 1 is a circuit diagram showing an example of the prior art.

This double integral type A/D converter of the present invention is different from the example of the prior art shown in FIGS. 1 and 2 in the points, as will be itemized in the following:

(1) The comparator C is equipped with a transistor having its collector or drain open so that its output voltage changes within a range from $+V_1$ to $-V_2$.

(2) To the offset correction circuit, there is added an integration circuit (or a low-pass filter) which is composed of a resistor $R_c$ and a capacitor $C_c$, the constants of which elements $R_c$ and $C_c$ are so set that a pulse may be output in the offset correction mode by the comparator C.

(3) In the offset correction mode, the input level of the integrator B is set at either the offset voltage level of the buffer A located upsteam of the integrator B or the ground level so that the auto-zero capacitor $C_0$ connected to the input of the integrator B may be charged with the offset voltage of the whole system from the buffer A to the comparator C. Incidentally, the capacitances of the capacitors are set such that $C_0 >> C_c$.

The operations of the double integral type A/D converter in the offset correction mode according to the present invention will be described with reference to the timing chart of FIG. 4. Here, the description of the operations shared with the example of the prior art of FIGS. 1 and 2 will be omitted. When the unknown input voltage to be input to the integrator B has a positive (+) polarity, the output of the comparator C in the integration mode is held at $+V_1$. At the zero crossing instant of the output of the integrator B, moreover, the comparator C is inverted to receive an output generally at $-V_2$. As a result, the flip-flop E is reset at the falling edge of the pulse (e) to output a pulse (g) from its $\overline{Q}$ terminal. As a result, the counter F has its operation stopped, and then the offset correction circuit has its switch S₃ turned off so that the operation shifts to the offset correction mode.

In this offset correction mode, the output of the comparator C is generally at $-V_2$, and an integration circuit of $R_0C_0$ is formed so that the voltage at the non-inverter terminal of the integrator B begins to gradually drop. If that voltage then drops to even a lower level than the potential of the inverter terminal of the integrator B, i.e., the potential corresponding to the offset voltage of the buffer A, the output of the integrator B gradually reduces so that the operational amplifier of the comparator C is inverted to have its output-step transistor $T_r$ turned off. Then, the current flows from the side of $+V_1$ through the $R_cC_c$ circuit to the integration circuit $R_0C_0$. Because of the setting of $R_0C_0 \gg R_cC_c$, however, the potential of the non-inverted terminal of the integrator B is not allowed to rise except gradually. If, moreover, the potential exceeds the potential of the inverter terminal of the integrator B even slightly, the integrator output increases again gradually so that the transistor $T_r$ in the output section of the comparator C is instantly turned on to hold the output of the comparator C generally at $-V_2$.

From now on, the output of the comparator is held at an intermediate level between $+V_1$ and $-V_2$ while the operations described above are repeated, the inter-terminal voltage of the capacitor $C_0$ is held at a level corresponding to the offset voltage of the whole system leading from the buffer A to the comparator C [as depicted by a waveform (e) of FIG. 4].

Figure 5A:
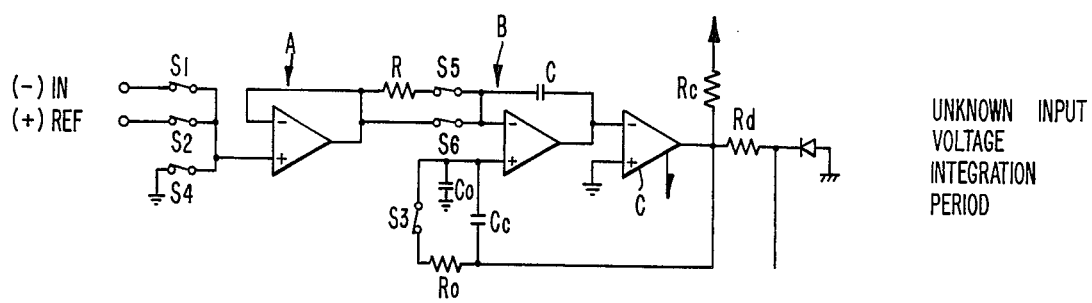
FIGS. 5(A) to 5(C) are circuit diagrams showing an essential portion of the A/D converter of FIG. 3 for explaining the operations of the same.
Figure 5B:
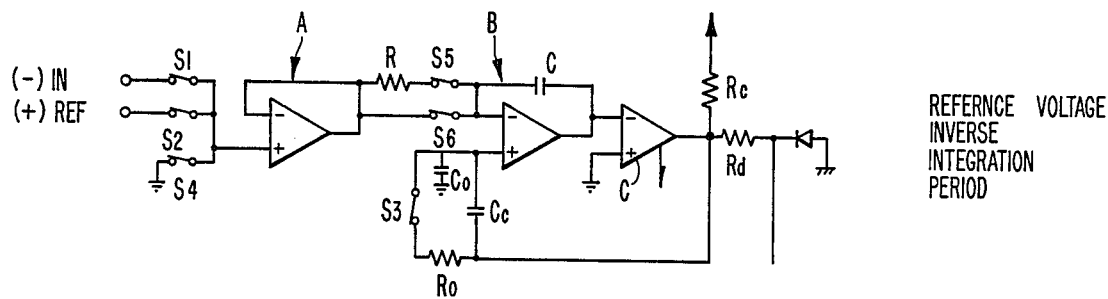
Figure 5C:
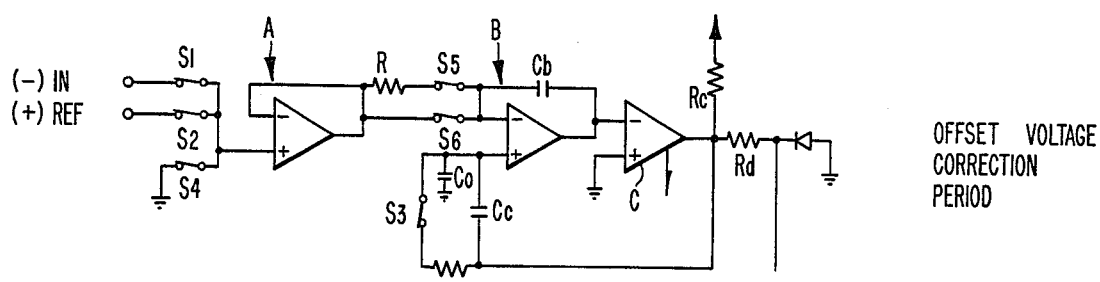

FIGS. 5(A) to 5(C) are circuit diagrams for explaining the switching operations of the embodiment thus far described. For the integration period of the unknown input voltage, as shown in FIG. 5(A), switches $S_1$ and $S_5$ are turned on whereas switches $S_2$, $S_3$, $S_4$ and $S_6$ are turned off. Next, for the integration period of the reference voltage, as shown in FIG. 5(B), the switch $S_1$ is turned off, but the switch $S_2$ is turned on, whereas all the remaining switches $S_3$ to $S_6$ are left as they were in FIG. 5(A). For the correction period of the offset voltage, as shown in FIG. 5(C), the switches $S_1$ and $S_2$ are turned off, but the switch $S_4$ is turned on to hold the input of the buffer A at the ground level. At the same time: the switch $S_5$ is turned off; the switch $S_6$ is turned on; and the switch $S_3$ is turned on to operate the offset correction circuit.

Figures 6, 7E, 7F:
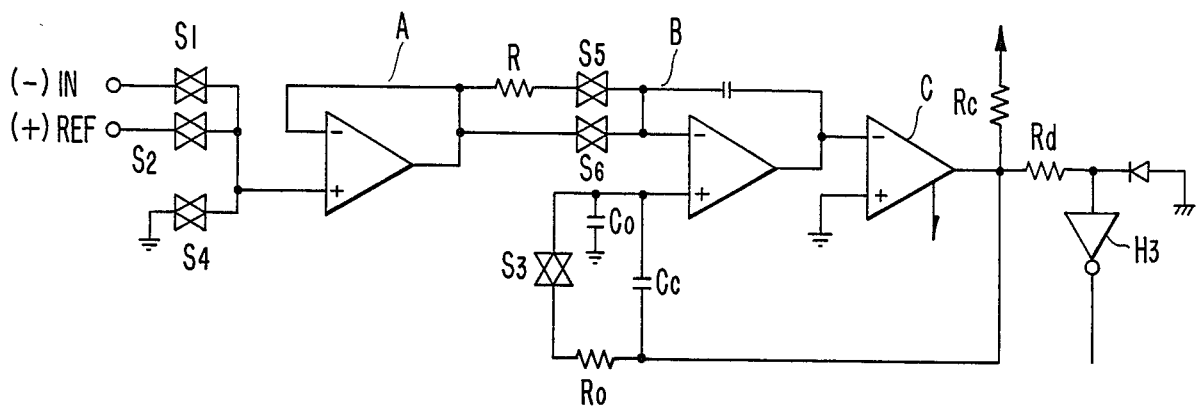
FIG. 6 is similar to FIGS. 5(A) to 5(C) but explains the operations of a second embodiment of the present invention.
Figure 8:
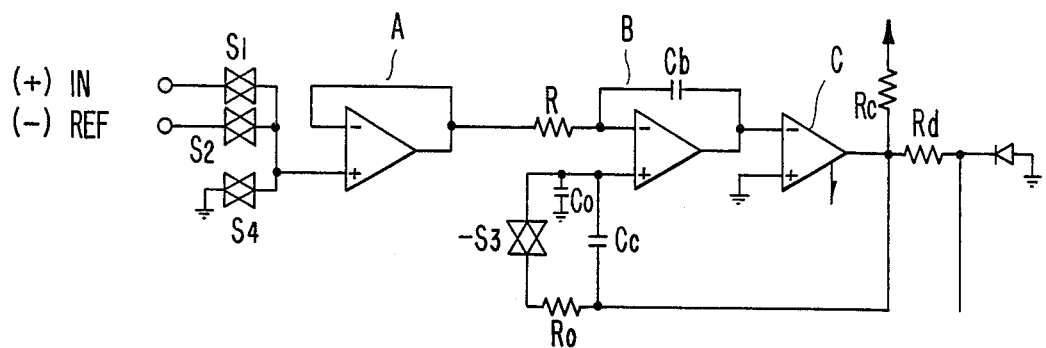
FIGS. 8 to 11 are similar to FIGS. 5(A) to 5(C) but explain the operations of other embodiments of the present invention.
Figure 9:
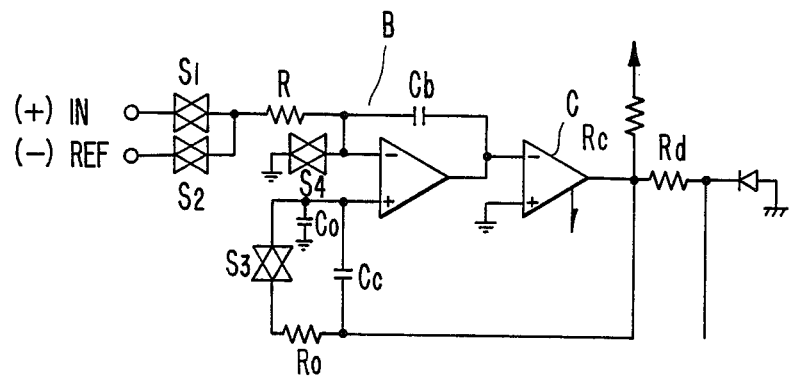
Figure 10:
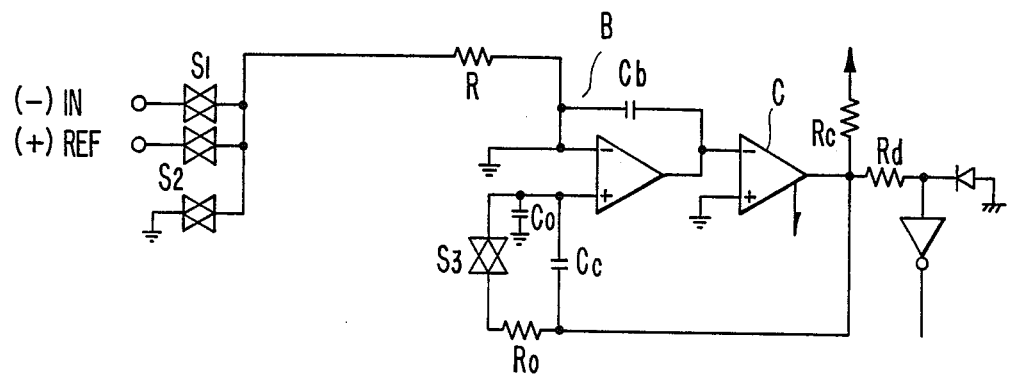
Figure 11:
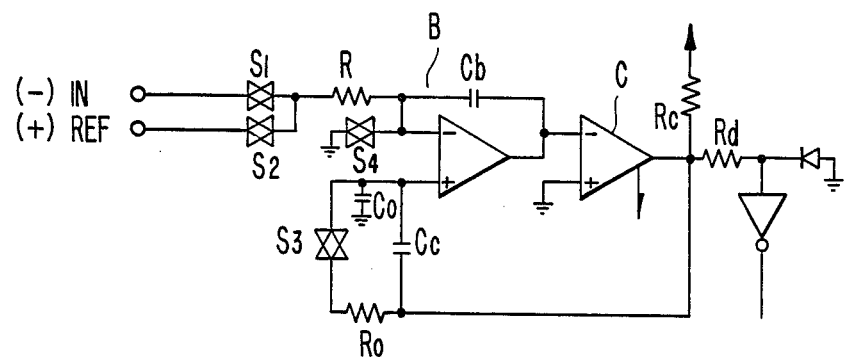

FIG. 6 is a circuit diagram showing a second embodiment of the present invention, in which the unknown input voltage is set at a negative (−) polarity. Since, in this embodiment, the output of the comparator C in the integration mode is set at the "L" level, an inverter $H_3$ is additionally connected with the output of the comparator C so that the operational level for the reset terminal of the flip-flop E may be equal to that of the foregoing first embodiment. Incidentally, the switches $S_1$ to $S_6$ are exemplified by electronic switches. This second embodiment has operations substantially similar to those of the first embodiment. Since the second embodiment has its input polarity reversed and its integrator output inverted, however, the waveforms (e) and (f) appearing in the timing chart of FIG. 4 are modified into those of FIG. 7.

The operations of the second embodiment will be described below. When the unknown input voltage takes the negative (−) polarity, the output of the comparator C in the integration mode is substantially at the level of $-V_2$. When the inverse integration by the reference voltage then terminates, the operational amplifier forming a component of the comparator C is reversed to turn off the transistor $T_r$ at its output step. Then, the current flows from the side of $+V_1$ through $R_cC_cC_0$ so that the level of the output of the comparator C gradually rises. At the instant when that output exceeds a predetermined value, the output of the inverter $H_3$ is reversed from the "H" level to the "L" level. At this falling edge, the flip-flop E is reset, and the counter F is stopped so that the operation shifts to the offset correction mode.

In the offset correction mode, the integration circuit $R_0$ and $C_0$ is provided so that the potential at the non-inverter terminal of the integrator B is gradually raised by the output of the comparator C, which is held at the "H" level. If the potential slightly exceeds the potential of the inverter terminal of the integrator B, moreover, the output of the integrator B gradually increases so that the comparator C is reversed to take substantially the level of $-V_2$ at its output.

From this point on, the operations are similar to those in the case of the first embodiment and are repeated until the comparator output is held substantially at an intermediate level between $+V_1$ and $-V_2$ and until the inter-terminal voltage of the auto-zero capacitor $C_0$ is held at a level corresponding to the offset voltage of the whole system.

FIGS. 8 to 11 are circuit diagrams according to other embodiments of the present invention, respectively. Although the connection of the input of the integrator B is modified, the polarity of the comparator and the construction of the offset correction circuit are made similar to those of the second embodiment shown in FIGS. 6 and 7.

Figure 12:
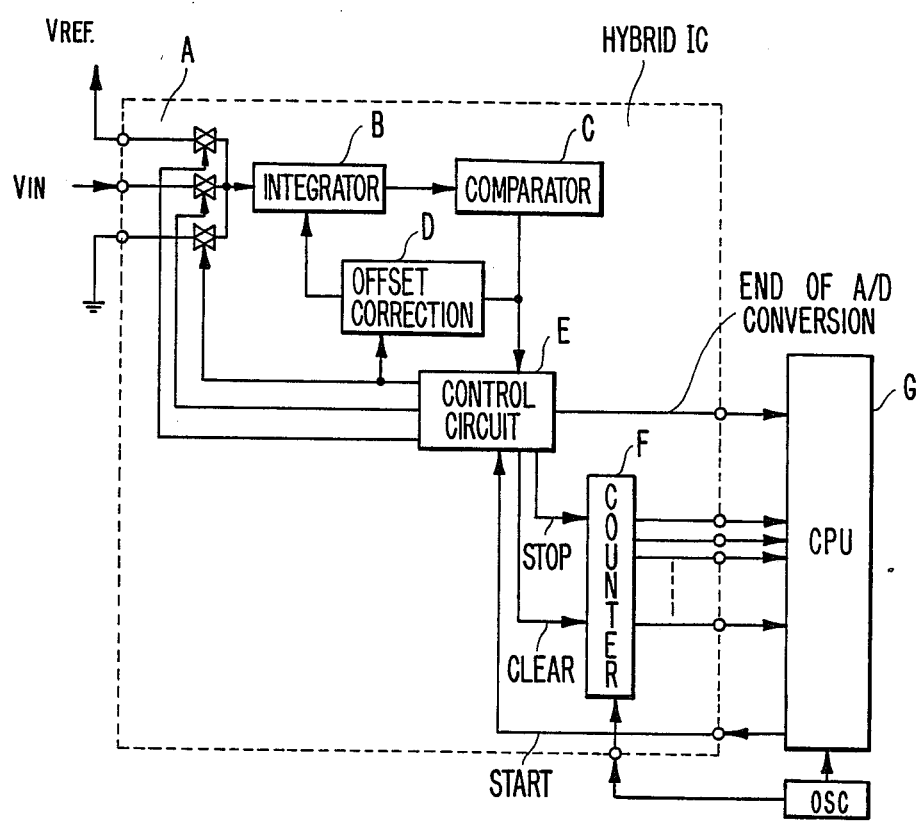
FIG. 12 is a block diagram showing a portion of the double integral type A/D converter as constructed as a hybrid IC according to the present invention.
Figure 13:
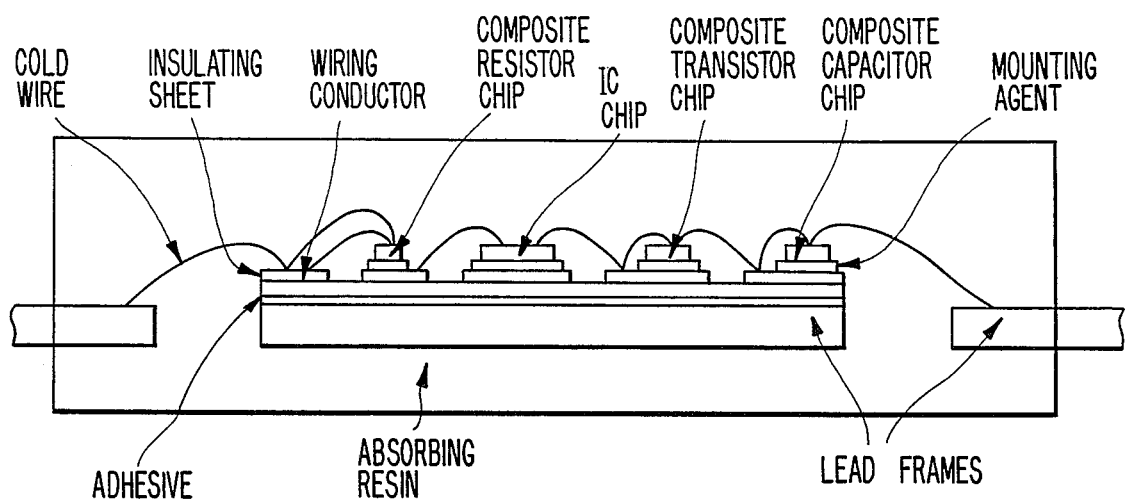
FIG. 13 is a section showing the hybrid IC of FIG. 12.

FIG. 12 is a block diagram showing a circuit of an electronic weighing system constructed as a hybrid IC in accordance with a further embodiment of the present invention. In this embodiment, the circuit portion enclosed by broken lines in FIG. 12 is assembled into the hybrid IC. In FIG. 12: reference letter A denotes a group of switches; letter B an integrator; letter C a comparator; letter D an offset correction circuit; letter E a control circuit; letter F a counter; and letter G a microcomputer.

This hybrid IC is formed by the following process. An insulating sheet having wired conductors is applied to a lead frame for a semiconductor IC. The individual circuit elements appearing within the above-mentioned broken lines are mounted on the insulating sheet. Those circuit elements are then connected by wire bonding and sealed with a resin using transfer molding, as shown in the section in FIG. 13.

Figure 14:
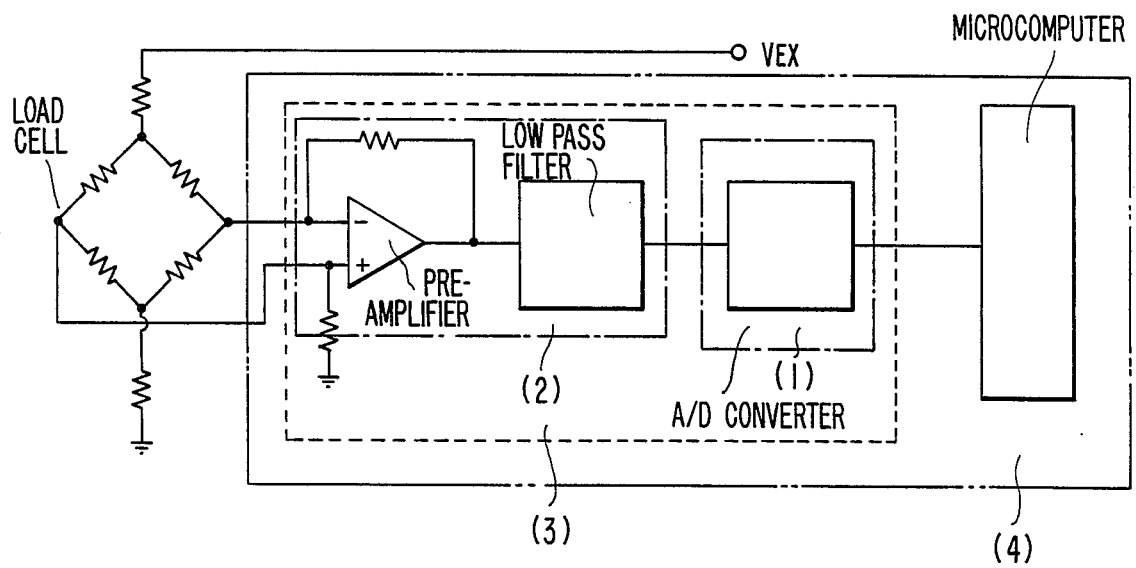
FIG. 14 is a schematic block diagram showing an electronic weighing system to be used with the double integral type A/D converter according to the present invention.

Incidentally, the electronic weighing system is constructed of a load cell, a pre-amplifier, a low-pass filter, an A/D converter, a microcomputer and so on, as shown in a schematic block diagram in FIG. 14, of which the circuit elements to be assembled into the hybrid IC can be selected from the following groups:

(1) the A/D converter;
(2) the low-pass filter and the A/D converter;
(3) the pre-amplifier, the low-pass filter and the A/D converter; and
(4) the pre-amplifier, the low-pass filter, the A/D converter and the microcomputer.

As has been described hereinbefore, according to the primary feature of the present invention, the complicated zero crossing detector may be dispensed with, and the offset correction is conducted merely by connecting the comparator, having the open-collector or -drain transistor, with the output of the integrator and by adding the integration circuit (i.e., the low-pass filter) to the offset correction circuit. As a result, the circuit structure can be simplified to reduce the number of parts and to drop the production cost.

In the offset mode, moreover, the auto-zero capacitor $C_0$ is charged with the offset voltage of the whole system leading from the buffer upstream of the integrator to the comparator downstream of the same by setting the input level of the intervening integrator at either the offset voltage level of the buffer or the ground level. As a result, the offset correction can be accurately achieved.

According to the secondary feature of the present invention, the following effects can be achieved:

(1) The A/D converter can be packaged into the hybrid IC having a heat resistance and a reliability similar to the monolithic IC.

(2) If the hybrid IC of the present invention is used, the circuitry can be smaller more than the hybrid IC of the prior art, and the present hybrid IC can have its strength improved to reduce the production ratio of inferior products which might otherwise occur because of careless handling.

(3) If the hybrid IC of the present invention is used with the electronic weighing system, most of the circuit elements such as the load cell, the pre-amplifier, the low-pass filter and/or the A/D converter can be integrated to have a shape similar to that of the monolithic IC. As a result, the number of parts to be mounted on the substrate can be minimized while the number of assembly steps are reduced for production.

What is claimed is:

1. A double integral type A/D converter for converting an analog signal into a digital signal, comprising:
    an integrator producing an output, and having a first terminal receiving one of an unknown input voltage and a reference voltage, a second terminal, and integration and offset correction modes;
    a comparator producing an output, and connected to said integrator and including a transistor having a collector or drain open;
    offset correction means, connected between said comparator and the second terminal of said integrator, for feeding back the output of said comparator and including a series circuit comprising a switch, a first resistor and an auto-zero capacitor;
    a flip-flop responsive to the output of said comparator for periodically switching the operational mode of said integrator from the integration mode to the offset correction mode and activating the switch of said offset correction means;
    a counter for counting an inverse integration period of said reference voltage;
    reset means for inverting the output of said comparator at a zero crossing of the output of said integrator resetting said flip-flop to stop the operation of said counter; and
    integration switching means, inserted in said offset correction means and including an integration resistor and an integration capacitor, for turning on said switch to shift said integrator to said offset correction mode, said auto-zero capacitor being charged with a voltage corresponding to the offset voltage of a circuit including said integrator and said comparator.

2. A double integral type A/D converter according to claim 1, wherein said unknown input voltage and said reference voltage input to said integrator have polarities set at positive and negative values, respectively.

3. A double integral type A/D converter according to claim 1, wherein said unknown input voltage and said reference voltage input to said integrator have their polarities set at negative and positive values, respectively.

4. A hybrid double integral type A/D converter integrated circuit (IC) for converting an analog signal into a digital signal, comprising:
    a group of switches for selectively outputting an input signal;
    an integrator receiving the input signal output selectively from said group of switches for integrating same;
    a comparator connected to said integrator and including a transistor having its collector or drain open and producing an output;
    offset correction means for correcting the offset voltage of a circuit including said integrator and said comparator by feeding back the output of said comparator to said integrator;
    a counter for counting an inverse integration period of a reference voltage; and
    a flip-flop for controlling said group of switches, said offset correction circuit and said counter in a predetermined manner and periodically activating said offset correction means;
    a lead frame for a semiconductor IC;
    a wired insulating sheet applied to said lead frame and mounting thereon at least said group of switches, said integrator, said comparator, said offset correction means, said counter and said flip-flop as a chip;
    a plurality of wires bonded to said insulating sheet for connecting said group of switches, said integrator, said comparator, said offset correction means, said counter and said flip-flop; and
    a resin armoring said lead frame, said insulating sheet and said wires together with said group of switches, said integrator, said comparator, said offset correction means, said counter and said flip-flop and created by transfer molding.

5. A hybrid double integral type A/D converter integrated circuit as recited in claim 4, further comprising a low-pass filter connected to one of the switches in said group of switches and providing the input signal.

6. A hybrid double integral type A/D converter integrated circuit as recited in claim 5, further comprising a pre-amplifier connected to said low-pass filter.

7. A hybrid double integral type A/D converter integrated circuit as recited in claim 6, further comprising a microcomputer connected to said flip-flop and said counter.

8. A hybrid integral internal type A/D converter according to claim 4, wherein said offset correction means comprises:
    a resistor connected to said transistor;
    a coupling capacitor connected between said transistor and said integrator;
    a switch controlled by said flip-flop and connected between said resistor and said integrator; and
    an auto-zero capacitor connected to said integrator, said switch and ground.

* * * * *